(12) United States Patent
Cady et al.

(10) Patent No.: US 7,768,796 B2
(45) Date of Patent: Aug. 3, 2010

(54) DIE MODULE SYSTEM

(75) Inventors: James W. Cady, Solana Beach, CA (US); Paul Goodwin, Austin, TX (US)

(73) Assignee: Entorian Technologies L.P., Austin, TX (US)

( * ) Notice: Subject to any disclaimer, the term of this patent is extended or adjusted under 35 U.S.C. 154(b) by 0 days.

(21) Appl. No.: 12/147,218

(22) Filed: Jun. 26, 2008

(65) Prior Publication Data

US 2008/0278924 A1 Nov. 13, 2008

Related U.S. Application Data (63) Continuation of application No. 11/157,565, filed on Jun. 21, 2005, now Pat. No. 7,423,885, which is a continuation-in-part of application No. 11/007,551, filed on Dec. 8, 2004, now Pat. No. 7,511,968, which is a continuation-in-part of application No. 10/934,027, filed on Sep. 3, 2004.

(51) Int. Cl.
  *H05K 1/11* (2006.01)
  *H05K 1/14* (2006.01)
(52) U.S. Cl. ............... 361/803; 361/782; 361/784; 361/749; 174/254
(58) Field of Classification Search ............ 361/749, 361/782–785, 803; 174/254, 259–260
  See application file for complete search history.

(56) References Cited

U.S. PATENT DOCUMENTS

| | | | |
|---|---|---|---|
| 3,372,310 A | 3/1968 | Kantor | |
| 3,436,604 A | 4/1969 | Hyltin | |
| 3,582,865 A | 6/1971 | Franck et al | |
| 3,654,394 A | 4/1972 | Gordon | |
| 3,704,455 A | 11/1972 | Scarbrough | |
| 3,718,842 A | 2/1973 | Abbot, III et al. | |
| 3,727,064 A | 4/1973 | Bottini | |
| 3,746,934 A | 7/1973 | Stein | |
| 3,766,439 A | 10/1973 | Issacson | |
| 3,772,776 A | 11/1973 | Weisenburger | |
| 4,169,642 A | 10/1979 | Mouissie | |
| 4,288,841 A | 9/1981 | Gogal | |
| 4,342,069 A | 7/1982 | Link | |
| 4,429,349 A | 1/1984 | Zachry | |

(Continued)

FOREIGN PATENT DOCUMENTS

EP 122-687 (A) 10/1984

(Continued)

OTHER PUBLICATIONS

PCT/US06/007193, International Search Report and Written Opinion, PCT, Nov. 7, 2007.

(Continued)

*Primary Examiner*—Tuan T Dinh (57) ABSTRACT

A flex circuit is populated on one or both sides with plural integrated circuit die. In a preferred mode, the flex circuit is populated with flip-chip die. One side of the flex circuit has a connective facility implemented in a preferred mode with edge connector contacts. The flex circuit is disposed about a substrate to form a circuit module that may be inserted into an edge connector such as ones typically found on a computer board.

8 Claims, 7 Drawing Sheets

U.S. PATENT DOCUMENTS

| | | |
|---|---|---|
| 4,437,235 A | 3/1984 | McIver |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, 3rd et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewiez et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,285,398 A | 2/1994 | Janik et al. |
| 5,289,062 A | 2/1994 | Wyland |
| 5,309,986 A | 5/1994 | Itoh |
| 5,313,097 A | 5/1994 | Haj-Ali-Ahmadi et al. |
| 5,347,428 A | 9/1994 | Carson et al. |
| 5,362,656 A | 11/1994 | McMahon |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,448,511 A | 9/1995 | Paurus et al. |
| 5,477,082 A | 12/1995 | Buckley, III et al. |
| 5,491,612 A | 2/1996 | Nicewarner, Jr. et al. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,688,606 A | 11/1997 | Mahulikar et al. |
| 5,708,297 A | 1/1998 | Clayton |
| 5,714,802 A | 2/1998 | Cloud et al. |
| 5,717,556 A | 2/1998 | Yanagida |
| 5,729,894 A | 3/1998 | Rostoker et al. |
| 5,731,633 A | 3/1998 | Clayton |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner, Jr. et al. |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bolleson |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,008,538 A | 12/1999 | Akram et al. |
| 6,014,316 A | 1/2000 | Eide |
| 6,021,048 A | 2/2000 | Smith |
| 6,025,992 A | 2/2000 | Dodge et al. |
| 6,028,352 A | 2/2000 | Eide |
| 6,028,365 A | 2/2000 | Akram et al. |
| 6,034,878 A | 3/2000 | Osaka et al. |
| 6,038,132 A | 3/2000 | Tokunaga et al. |
| 6,040,624 A | 3/2000 | Chambers et al. |
| 6,049,975 A | 4/2000 | Clayton |
| 6,060,339 A | 5/2000 | Akram et al. |
| 6,072,233 A | 6/2000 | Corisis et al. |
| 6,078,515 A | 6/2000 | Nielsen et al. |
| 6,084,294 A | 7/2000 | Tomita |
| 6,091,145 A | 7/2000 | Clayton |
| 6,097,087 A | 8/2000 | Farnworth et al. |

| Patent | Date | Inventor |
|---|---|---|
| 6,111,757 A | 8/2000 | Dell et al. |
| 6,121,676 A | 9/2000 | Solberg |
| RE36,916 E | 10/2000 | Moshayedi |
| 6,157,541 A | 12/2000 | Hacke |
| 6,172,874 B1 | 1/2001 | Bartilson |
| 6,178,093 B1 | 1/2001 | Bhatt et al. |
| 6,180,881 B1 | 1/2001 | Isaak |
| 6,187,652 B1 | 2/2001 | Chou et al. |
| 6,205,654 B1 | 3/2001 | Burns |
| 6,208,521 B1 | 3/2001 | Nakatsuka |
| 6,208,546 B1 | 3/2001 | Ikeda |
| 6,214,641 B1 | 4/2001 | Akram |
| 6,215,181 B1 | 4/2001 | Akram et al. |
| 6,215,687 B1 | 4/2001 | Sugano et al. |
| 6,222,737 B1 | 4/2001 | Ross |
| 6,222,739 B1 | 4/2001 | Bhakta et al. |
| 6,225,688 B1 | 5/2001 | Kim et al. |
| 6,232,659 B1 | 5/2001 | Clayton |
| 6,233,650 B1 | 5/2001 | Johnson et al. |
| 6,234,820 B1 | 5/2001 | Perino et al. |
| 6,262,476 B1 | 7/2001 | Vidal |
| 6,262,895 B1 | 7/2001 | Forthun |
| 6,265,660 B1 | 7/2001 | Tandy |
| 6,266,252 B1 | 7/2001 | Karabatsos |
| 6,281,577 B1 | 8/2001 | Oppermann et al. |
| 6,288,907 B1 | 9/2001 | Burns |
| 6,288,924 B1 | 9/2001 | Sugano et al. |
| 6,300,679 B1 | 10/2001 | Mukerji et al. |
| 6,316,825 B1 | 11/2001 | Park et al. |
| 6,323,060 B1 | 11/2001 | Isaak |
| 6,336,262 B1 | 1/2002 | Dalal et al. |
| 6,343,020 B1 | 1/2002 | Lin et al. |
| 6,347,394 B1 | 2/2002 | Ochoa et al. |
| 6,349,050 B1 | 2/2002 | Woo et al. |
| 6,351,029 B1 | 2/2002 | Isaak |
| 6,357,023 B1 | 3/2002 | Co et al. |
| 6,358,772 B2 | 3/2002 | Miyoshi |
| 6,360,433 B1 | 3/2002 | Ross |
| 6,368,896 B2 | 4/2002 | Farnworth et al. |
| 6,370,668 B1 | 4/2002 | Garrett, Jr. et al. |
| 6,376,769 B1 | 4/2002 | Chung |
| 6,392,162 B1 | 5/2002 | Karabatsos |
| 6,404,043 B1 | 6/2002 | Isaak |
| 6,410,857 B1 | 6/2002 | Gonya |
| 6,426,240 B2 | 7/2002 | Isaak |
| 6,426,549 B1 | 7/2002 | Isaak |
| 6,426,560 B1 | 7/2002 | Kawamura et al. |
| 6,428,360 B2 | 8/2002 | Hassanzadeh et al. |
| 6,433,418 B1 | 8/2002 | Fujisawa et al. |
| 6,444,921 B1 | 9/2002 | Wang et al. |
| 6,446,158 B1 | 9/2002 | Karabatsos |
| 6,449,159 B1 | 9/2002 | Haba |
| 6,452,826 B1 | 9/2002 | Kim et al. |
| 6,459,152 B1 | 10/2002 | Tomita et al. |
| 6,462,412 B2 | 10/2002 | Kamei et al. |
| 6,465,877 B1 | 10/2002 | Farnworth et al. |
| 6,465,893 B1 | 10/2002 | Khandros et al. |
| 6,472,735 B2 | 10/2002 | Isaak |
| 6,473,308 B2 | 10/2002 | Forthun |
| 6,486,544 B1 | 11/2002 | Hashimoto |
| 6,489,687 B1 | 12/2002 | Hashimoto |
| 6,502,161 B1 | 12/2002 | Perego et al. |
| 6,514,793 B2 | 2/2003 | Isaak |
| 6,521,984 B2 | 2/2003 | Matsuura |
| 6,528,870 B2 | 3/2003 | Fukatsu et al. |
| 6,531,772 B2 | 3/2003 | Akram et al. |
| 6,544,815 B2 | 4/2003 | Isaak |
| 6,552,910 B1 | 4/2003 | Moon et al. |
| 6,552,948 B2 | 4/2003 | Woo et al. |
| 6,560,117 B2 | 5/2003 | Moon |
| 6,566,746 B2 | 5/2003 | Isaak et al. |
| 6,572,387 B2 | 6/2003 | Burns et al. |
| 6,573,593 B1 | 6/2003 | Syri et al. |
| 6,576,992 B1 | 6/2003 | Cady et al. |
| 6,588,095 B2 | 7/2003 | Pan |
| 6,590,282 B2 | 7/2003 | Wang et al. |
| 6,600,222 B1 | 7/2003 | Levardo |
| 6,614,664 B2 | 9/2003 | Lee |
| 6,627,984 B2 | 9/2003 | Bruce et al. |
| 6,629,855 B1 | 10/2003 | North et al. |
| 6,646,936 B2 | 11/2003 | Hamamatsu et al. |
| 6,660,561 B2 | 12/2003 | Forthun |
| 6,661,092 B2 | 12/2003 | Shibata et al. |
| 6,677,670 B2 | 1/2004 | Kondo |
| 6,683,377 B1 | 1/2004 | Shim et al. |
| 6,690,584 B2 | 2/2004 | Uzuka et al. |
| 6,699,730 B2 | 3/2004 | Kim et al. |
| 6,720,652 B2 | 4/2004 | Akram et al. |
| 6,721,181 B2 | 4/2004 | Pfeifer et al. |
| 6,721,185 B2 | 4/2004 | Dong et al. |
| 6,721,226 B2 | 4/2004 | Woo et al. |
| 6,744,656 B2 | 6/2004 | Sugano et al. |
| 6,751,113 B2 | 6/2004 | Bhakta et al. |
| 6,756,661 B2 | 6/2004 | Tsuneda et al. |
| 6,760,220 B2 | 7/2004 | Canter et al. |
| 6,762,942 B1 | 7/2004 | Smith |
| 6,768,660 B2 | 7/2004 | Kong et al. |
| 6,833,981 B2 | 12/2004 | Suwabe et al. |
| 6,833,984 B1 | 12/2004 | Belgacem |
| 6,839,266 B1 | 1/2005 | Garrett, Jr. et al. |
| 6,841,868 B2 | 1/2005 | Akram et al. |
| 6,850,414 B2 | 2/2005 | Benisek et al. |
| 6,873,534 B2 | 3/2005 | Bhakta et al. |
| 6,878,571 B2 | 4/2005 | Isaak et al. |
| 6,884,653 B2 | 4/2005 | Larson |
| 6,914,324 B2 | 7/2005 | Rapport et al. |
| 6,919,626 B2 | 7/2005 | Burns |
| 6,956,284 B2 | 10/2005 | Cady et al. |
| 7,053,478 B2 | 5/2006 | Roper et al. |
| 7,094,632 B2 | 8/2006 | Cady et al. |
| 7,180,167 B2 | 2/2007 | Partridge et al. |
| 7,393,226 B2 | 7/2008 | Clayton et al. |
| 7,394,149 B2 | 7/2008 | Clayton et al. |
| 2001/0013423 A1 | 2/2001 | Dalal et al. |
| 2001/0001085 A1 | 5/2001 | Hassanzadeh et al. |
| 2001/0006252 A1 | 7/2001 | Kim et al. |
| 2001/0015487 A1 | 8/2001 | Forthun |
| 2001/0026009 A1 | 10/2001 | Tsuneda et al. |
| 2001/0028588 A1 | 10/2001 | Yamada et al. |
| 2001/0035572 A1 | 11/2001 | Isaak |
| 2001/0040793 A1 | 11/2001 | Ihaba |
| 2001/0052637 A1 | 12/2001 | Akram et al. |
| 2002/0001216 A1 | 1/2002 | Sugano et al. |
| 2002/0006032 A1 | 1/2002 | Karabatsos |
| 2002/0030995 A1 | 3/2002 | Shoji |
| 2002/0076919 A1 | 6/2002 | Peters et al. |
| 2002/0094603 A1 | 7/2002 | Isaak |
| 2002/0101261 A1 | 8/2002 | Karabatsos |
| 2002/0139577 A1 | 10/2002 | Miller |
| 2002/0164838 A1 | 11/2002 | Moon et al. |
| 2002/0180022 A1 | 12/2002 | Emoto |
| 2002/0185731 A1 | 12/2002 | Akram et al. |
| 2002/0196612 A1 | 12/2002 | Gall et al. |
| 2003/0002262 A1 | 1/2003 | Benisek et al. |
| 2003/0026155 A1 | 2/2003 | Yamagata |
| 2003/0035328 A1 | 2/2003 | Hamamatsu et al. |
| 2003/0045025 A1 | 3/2003 | Coyle et al. |
| 2003/0049886 A1 | 3/2003 | Salmon |
| 2003/0064548 A1 | 4/2003 | Isaak |
| 2003/0081387 A1 | 5/2003 | Schulz |
| 2003/0081392 A1 | 5/2003 | Cady et al. |
| 2003/0089978 A1 | 5/2003 | Miyamoto et al. |
| 2003/0090879 A1 | 5/2003 | Doblar et al. |
| 2003/0096497 A1 | 5/2003 | Moore et al. |
| 2003/0109078 A1 | 6/2003 | Takahashi et al. |
| 2003/0116835 A1 | 6/2003 | Miyamoto et al. |

| | | | |
|---|---|---|---|
| 2003/0159278 A1 | 8/2003 | Peddle | |
| 2003/0168725 A1 | 9/2003 | Warner et al. | |
| 2004/0000708 A1 | 1/2004 | Rapport et al. | |
| 2004/0012991 A1 | 1/2004 | Kozaru | |
| 2004/0021211 A1 | 2/2004 | Damberg | |
| 2004/0099938 A1 | 5/2004 | Kang et al. | |
| 2004/0150107 A1 | 8/2004 | Cha et al. | |
| 2004/0229402 A1 | 11/2004 | Cady et al. | |
| 2004/0236877 A1 | 11/2004 | Burton | |
| 2005/0082663 A1 | 4/2005 | Wakiyama et al. | |
| 2005/0108468 A1 | 5/2005 | Hazelzet et al. | |
| 2005/0133897 A1 | 6/2005 | Baek et al. | |
| 2005/0242423 A1 | 11/2005 | Partridge et al. | |
| 2005/0263911 A1 | 12/2005 | Igarashi et al. | |
| 2006/0020740 A1 | 1/2006 | Bartley et al. | |
| 2006/0050496 A1 | 3/2006 | Goodwin | |
| 2006/0050497 A1 | 3/2006 | Goodwin | |
| 2006/0053345 A1 | 3/2006 | Goodwin | |
| 2006/0091529 A1 | 5/2006 | Wehrly et al. | |
| 2006/0095592 A1 | 5/2006 | Borkenhagen | |
| 2006/0111866 A1 | 5/2006 | LeClerg et al. | |
| 2006/0125067 A1 | 6/2006 | Wehrly et al. | |
| 2007/0211426 A1 | 9/2007 | Clayton et al. | |
| 2007/0211711 A1 | 9/2007 | Clayton | |
| 2007/0212906 A1 | 9/2007 | Clayton et al. | |
| 2007/0212920 A1 | 9/2007 | Clayton et al. | |
| 2008/0192428 A1 | 8/2008 | Clayton et al. | |

FOREIGN PATENT DOCUMENTS

| | | |
|---|---|---|
| EP | 0 298 211 A3 | 1/1989 |
| EP | 1 119049 A2 | 7/2001 |
| GB | 2 130 025 A | 5/1984 |
| JP | 53-85159 | 7/1978 |
| JP | 58-96756 (A) | 6/1983 |
| JP | 3-102862 | 4/1991 |
| JP | 5-29534 (A) | 2/1993 |
| JP | 5-335695 (A) | 12/1993 |
| JP | 2821315 (B2) | 11/1998 |
| JP | 2001/077294 (A) | 3/2001 |
| JP | 2001/085592 (A) | 3/2001 |
| JP | 2001/332683 (A) | 11/2001 |
| JP | 2002/009231 (A) | 1/2002 |
| JP | 2003/037246 A | 2/2003 |
| JP | 2003/086760 (A) | 3/2003 |
| JP | 2003/086761 (A) | 3/2003 |
| JP | 2003/309246 (A) | 10/2003 |
| JP | 2003/347503 (A) | 12/2003 |
| WO | WO03/037053 | 5/2003 |
| WO | WO 03/037053 A1 | 5/2003 |
| WO | WO 2004/109802 A1 | 12/2004 |

OTHER PUBLICATIONS

U.S. Appl. No. 11/306,803, Karabatsos.
PCT/US05/28547 International Search Report and Written Opinion, PCT, Aug. 18, 2006.
PCT/US05/28547 Notification Concerning Transmittal of International Preliminary Report on Patentability, Mar. 15, 2007.
GB 0516622.8 Search Report, May 25, 2006.
PCT/US06/04690 International Search Report, PCT, Feb. 16, 2007.
PCT/US06/38720 International Search Report and Written Opinion, PCT, Apr. 5, 2007.
Complaint filed Mar. 8, 2007, in the United States District Court for the District of Massachusetts, Boston Division, Civil Action No. 07 CA 10468 DPW.
Letter dated Sep. 11, 2006, from Chris Karabatsos of Kentron Technologies to John Kelly, President of JEDEC Solid State Technology Association, concerning potential interferences involving U.S. Appl. No. 11/306,803.
Pages 19-22 of presentation by Netlist, Aug. 2004.
Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on the internet.
Teresa uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Website 9 pages) Fjelstad, Joseph, Pacific Consultants L.L.C., Published Jan. 2001 on Internet.
Flexible Thinking: Examining the Flexible Circuit Tapes (Website 2 pages) Fjestad, Joseph., Published Apr. 20, 2000 on Internet.
Ron Bauer, Intel. "Stacked-CSP Delivers Flexibility, Reliability, and Space-Saving Capabilities", vol. 3, Spring 2002. Published on the Internet.
Tessera Technologies, Inc.—Semiconductor Intellectual Property, Chip Scale Packaging—Website pp. (3), Internet.
Tessera Introduces uZ a—Ball Stacked Memory Package for computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002 in San Jose, CA.
William R. Newberry, Design Techniques for Ball Grid Arrays, Xynetix Design Systems, Inc. Portland, Maine, Published on the Internet.
Chip Scale Packaging and Redistribution, Paul A. Magill, Glenn A. Rinne, J. Daniel Mis, Wayne C. Machon, Joseph W. Baggs, Unitive Electronics Inc.
Dense-Pac Microsystems, 16 Megabit High Speed CMOS SRAM DPS1MX16MKn3.
Dense-Pack Microsystems, 256 Megabyte CMOS DRAM DP3ED32MS72RW5.
Dense-Pack Microsystems,, Breaking Space Barriers, 3-D Technology 1993.
Dense-Pac Microsystems, DPS512X16A3, Ceramic 512K×16 CMOS SRAM Module.
IBM Preliminary 168 Pin SDRAM Registered DIMM Functional Description & timing Diagrams.
3D Interconnection for Ultra-Dense MultiChip Modules, Christian Val, Thomson-CSF DCS Computer Division, Thierry Lemonie, Thomson-CSF-RCM-Radar-Countermeasures Division.
High Density Memory Packaging Technology High Speed Imaging Applications, Dean Frew, Texas Instruments Incorporated.
Vertically-Intergrated Package, Alvin Weinberg, Pacesetter, Inc. and W. Kinzy Jones, Florida International University.

DIE MODULE SYSTEM

CROSS-REFERENCE TO RELATED APPLICATIONS

This application is a continuation of U.S. patent application Ser. No. 11/157,565, filed Jun. 21, 2005, which is a continuation-in-part of U.S. patent application Ser. No. 11/007,551, filed Dec. 8, 2004 which is a continuation-in-part of U.S. patent application Ser. No. 10/934,027, filed Sep. 3, 2004. U.S. patent application Ser. No. 11/157,565, U.S. patent application Ser. No. 11/007,551, and U.S. patent application Ser. No. 10/934,027 are each commonly owned by Entorian Technologies, L.P., formerly Staktek Group L.P., the assignee of record, and are each hereby incorporated by reference in their entireties into the present application.

TECHNICAL FIELD

The present invention relates to systems and methods for creating high density circuit modules and, in particular, systems and methods for creating such modules with integrated circuit die.

BACKGROUND

The well-known DIMM (Dual In-line Memory Module) board has been used for years, in various forms, to provide memory expansion. A typical DIMM includes a conventional PCB (printed circuit board) with memory devices and supporting digital logic devices mounted on both sides. The DIMM is typically mounted in the host computer system by inserting a contact-bearing edge of the DIMM into a card edge connector. Systems that employ DIMMs provide, however, very limited profile space for such devices and conventional DIMM-based solutions have typically provided only a moderate amount of memory expansion.

As bus speeds have increased, fewer devices per channel can be reliably addressed with a DIMM-based solution. For example, 288 ICs or devices per channel may be addressed using the SDRAM-100 bus protocol with an unbuffered DIMM. Using the DDR-200 bus protocol, approximately 144 devices may be address per channel. With the DDR2-400 bus protocol, only 72 devices per channel may be addressed. This constraint has led to the development of the fully-buffered DIMM (FB-DIMM) with buffered C/A and data in which 288 devices per channel may be addressed. With the FB-DIMM, not only has capacity increased, pin count has declined to approximately 69 signal pins from the approximately 240 pins previously required.

There are several known methods to improve the limited capacity of a DIMM or other circuit board. In one strategy, for example, small circuit boards (daughter cards) are connected to the DIMM to provide extra mounting space. The additional connection may cause, however, flawed signal integrity for the data signals passing from the DIMM to the daughter card and the additional thickness of the daughter card(s) increases the profile of the DIMM.

Multiple die packages (MDP) are also used to increase DIMM capacity while preserving profile conformity. This scheme increases the capacity of the memory devices on the DIMM by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

Stacked packages are yet another strategy used to increase circuit board capacity. This scheme increases capacity by stacking packaged integrated circuits to create a high-density circuit module for mounting on the circuit board. In some techniques, flexible conductors are used to selectively interconnect packaged integrated circuits. Staktek Group L.P., the present assignee, has developed numerous systems for aggregating CSP (chipscale packaged) devices in space saving topologies. The increased component height of some stacking techniques may alter, however, system requirements such as, for example, required cooling airflow or the minimum spacing around a circuit board on its host system.

Whether the application is for general purpose or specialized computing such as, for example, video processing, high capacity circuit modules can benefit from new methods and structures whether such modules are identified electrically, such as the FB-DIMM solution, for example, or by topology, such as SO-DIMMs for example, or by the type of circuitry employed, such as flash memory, for example.

SUMMARY

A flex circuit is populated on one or both sides with plural integrated circuit die. In a preferred mode, the flex circuit is populated with flip-chip die. One side of the flex circuit has a connective facility implemented in a preferred mode with edge connector contacts. The flex circuit is disposed about a substrate to form a circuit module that may be inserted into an edge connector such as typically found on a computer board.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
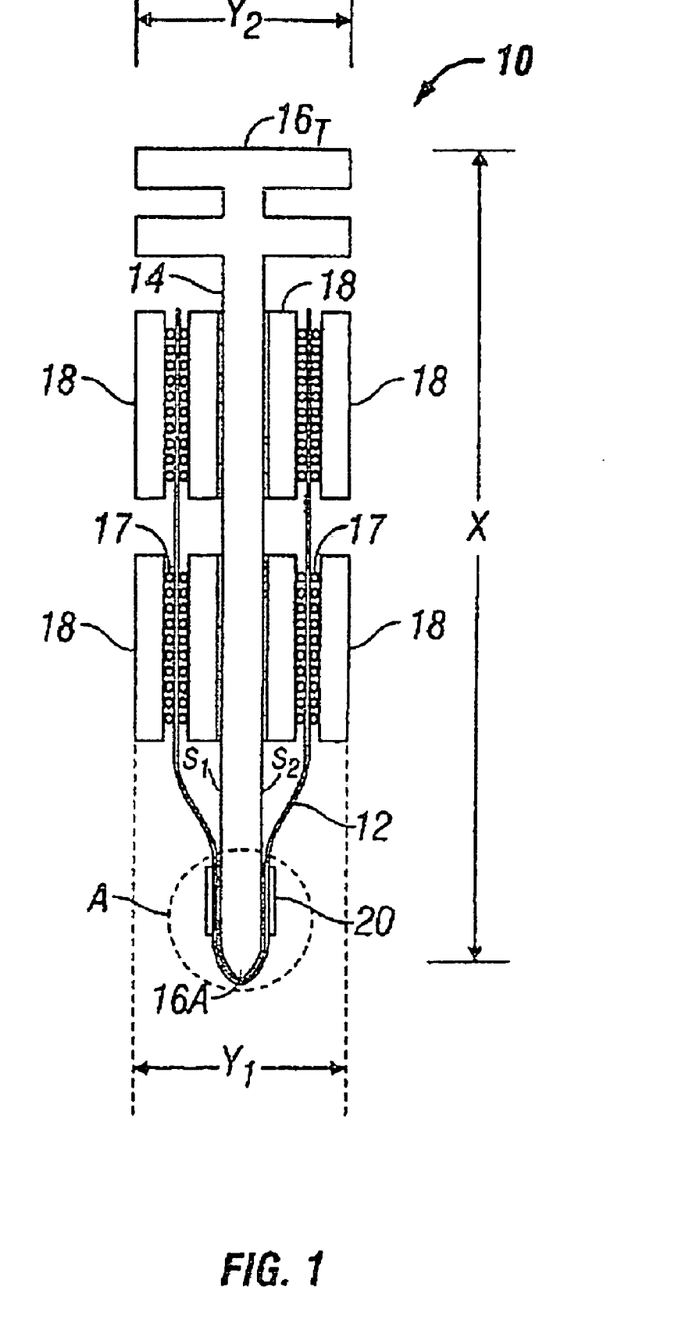
FIG. 1 is a cross-sectional depiction of a preferred embodiment of a module devised in accordance with the present invention.

FIG. 1 depicts a cross-sectional view of a preferred embodiment of a module 10 devised in accordance with the present invention. Module 10 is depicted in FIG. 1 exhibiting CSPs 18 which, in a preferred embodiment, are flip-chip die attached to flex circuit 12. Flip-chip CSPs 18 exhibit CSP contacts 17 for connection to the integrated circuit die of the flip-chip device.

Flex 12 is wrapped about perimeter edge 16A of substrate 14, which in the depicted embodiment, provides the basic shape of a common DIMM board form factor such as that defined by JEDEC standard MO-256. Substrate or support structure 14 typically has first and second lateral sides $S_1$ and $S_2$. Substrate 14 is preferably comprised of metallic material such as, for example, aluminum or a copper alloy. Substrate 14 is shown with multiple extensions 16T which have been shown to provide thermal advantages for module 10. Other embodiments may have greater or lesser numbers of such extensions and some embodiments lack any such an extension.

A preferred module 10 devised with flip-chip die would have a dimension Y2 in the range of between 5.0 mm and 8.00 mm, with a more preferred range of approximately 6.0 mm (+/−10%) and a preferred module 10 devised with flip-chip die would have a dimension X in the range between 25 mm and 36 mm with a more preferred range of approximately 30 mm (+/−10%). Those of skill will note that module 10 may be devised with fewer or more than the 72 ICs 18 depicted populating modules 10 shown in FIGS. 1-4.

Figure 2:
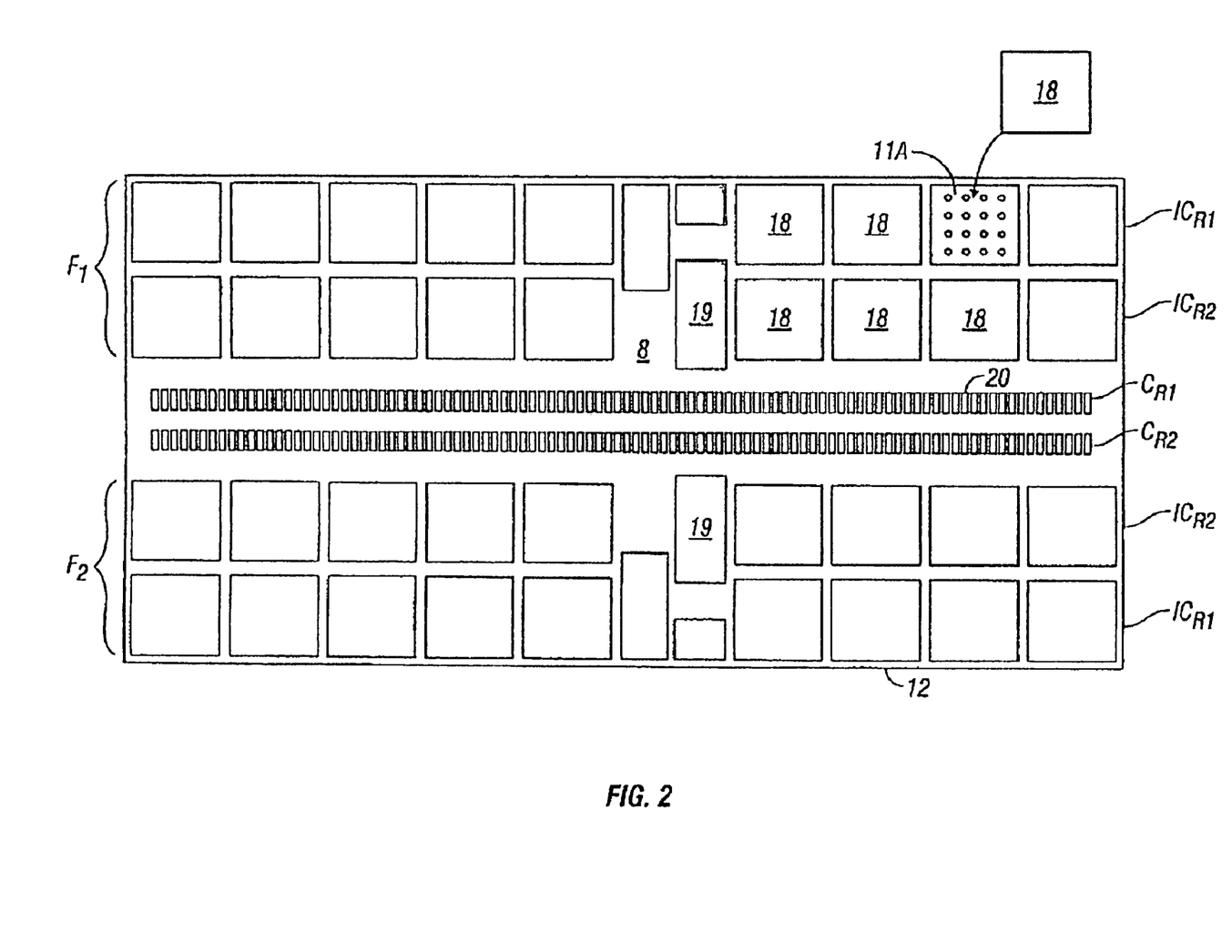
FIG. 2 depicts a contact bearing first side of a flex circuit devised in accordance with a preferred embodiment of the present invention.

FIG. 2 depicts a first side 8 of flex circuit 12 ("flex", "flex circuitry", "flexible circuit") used in constructing a module according to an embodiment of the present invention. Flex circuit 12 is preferably made from one or more conductive layers supported by one or more flexible substrate layers. The construction of flex circuitry is known in the art. The entirety of the flex circuit 12 may be flexible or, as those of skill in the art will recognize, the flexible circuit structure 12 may be made flexible in certain areas to allow conformability to required shapes or bends, and rigid in other areas to provide rigid and planar mounting surfaces.

CSPs 18 on flexible circuit 12 are, in this embodiment, flip-chip devices that are one species of CSP devices of small scale. For purposes of this disclosure, the term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a TSOP.

Where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA and flip-chip.

Flip-chip devices typify the CSPs 18 of preferred embodiments of the present disclosure. Mounting flip-chip components directly to flex circuitry is becoming better understood. For example, flip chip on flex (FcoF) typically can be implemented with, for example, a no-flow or reflow encapsulant (RE) underfill technology. The process consists of dispensing underfill, placing the die and processing. Soldering is typically performed concurrently with other devices which are present. Underfill may also be preapplied to the die. The amount of encapsulant required is, affected, as those of skill will recognize, by, for example, die size, initial and collapsed bump height, bump count, and layout of the flex circuit 12. There should be enough encapsulant to wet the bumps but not so much that a large excess fillet is created. Because the substrate is encapsulated during soldering, sometimes a significant amount of gas may outflow into the RE causing voids. Consequently out gassing during mounting should be controlled. After application, X-ray inspection is preferred with relatively low acceleration voltages being adequate.

The mechanical qualities of no-flow underfill are not equal to capillary flow material and coefficients of thermal expansion can be higher while elastic moduli lower. However, no-flow technologies are adaptable to contemporary manufacturing and are but one of several techniques known for attachment of flip-chip die to flex circuitry.

While in this embodiment memory flip-chip CSPs are used to provide a memory expansion board or module, various embodiments may include a variety of integrated circuits and other components in a variety of packages. Such variety may include microprocessors, FPGA's, RF transceiver circuitry, digital logic, as a list of non-limiting examples, or other circuits or systems which may benefit from a high-density circuit board or module capability. Circuits 19 depicted between CSPs 18 may be buffers or controllers or other circuitry and in a later Fig., circuit 19 is depicted as the well known advanced memory buffer or "AMB" as part of a module 10 that implements the fully-buffered DIMM electrical design.

The depiction of FIG. 2 shows flex circuit 12 as having first and second fields F1 and F2 for mounting circuit devices. Each of fields F1 and F2 have at least one mounting contact array for CSPs such as the one depicted by reference 11A. Contact arrays such as array 11 are disposed beneath CSPs 18 and circuits 19. An exemplar contact array 11A is shown as is exemplar CSP 18 to be mounted at contact array 11A as depicted. The contact arrays 11A that correspond to an IC plurality may be considered a contact array set.

Field F1 of side 8 of flex circuit 12 is shown populated with first plurality of CSPs $IC_{R1}$ and second plurality of CSPs $IC_{R2}$ while second field F2 of side 8 of flex circuit 12 is shown populated with first plurality of CSPs $IC_{R1}$ and second plurality of CSPs $IC_{R2}$. Those of skill will recognize that the identified pluralities of CSPs are, when disposed in the configurations depicted, typically described as "ranks". Between the ranks $IC_{R2}$ of field F1 and $IC_{R2}$ of field F2, flex circuit 12 bears a plurality of module contacts allocated in this embodiment into two rows ($C_{R1}$ and $C_{R2}$) of module contacts 20. Module contacts 20 are preferably adapted for connection to a circuit board socket such as, for example, an edge connector socket into which module 10 would be inserted. When flex circuit 12 is folded as later depicted, side 8 depicted in FIG. 2 is presented at the outside of module 10. The opposing side 9 of flex circuit 12 is on the inside in several depicted configurations of module 10 and thus side 9 is closer to the substrate 14 about which flex circuit 12 is disposed than is side 8. Other embodiments may have other numbers of ranks and combinations of plural CSPs connected to create the module of the present invention.

Figure 3:
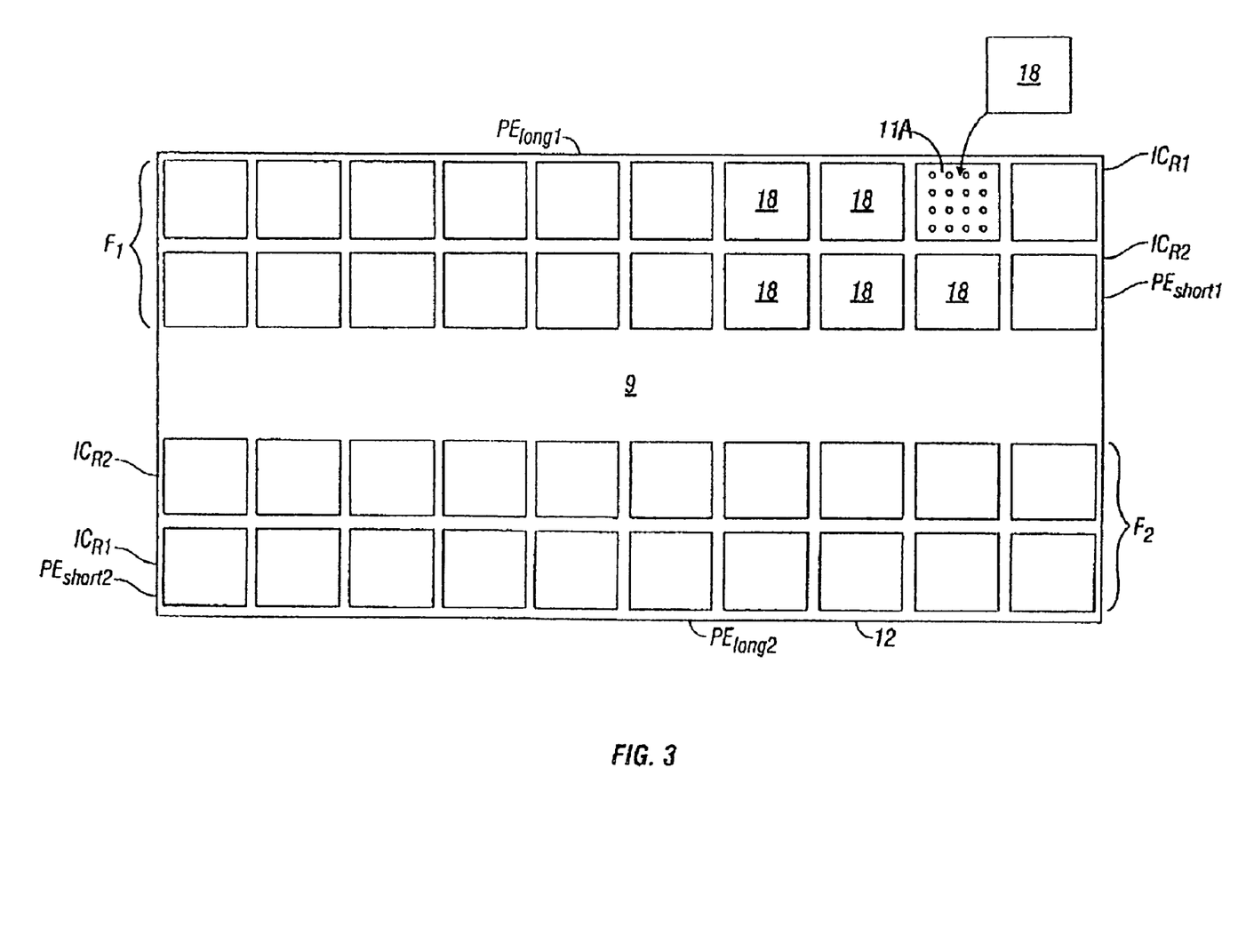
FIG. 3 depicts the second side of the exemplar populated flex circuit of FIG. 2.

FIG. 3 shows side 9 of flex circuit 12 depicting the other side of the flex circuit shown in FIG. 2. Side 9 of flex circuit 12 is shown as being populated with multiple flip-chip CSPs 18. Side 9 includes fields F1 and F2 that each include at least one mounting contact array site for CSPs and, in the depicted case, include multiple contact arrays. Each of fields F1 and F2 include, in the depicted preferred embodiment, two pluralities of ICs identified in FIG. 3 as $IC_{R1}$ and $IC_{R2}$. Thus, each side of flex circuit 12 has, in a preferred embodiment, two fields F1 and F2 each of which fields includes two ranks of CSPs $IC_{R1}$ and $IC_{R2}$. In later FIG. 4, it will be recognized that fields F1 and F2 will be disposed on different sides of substrate 14 in a completed module 10 when CSPs 18 are identified according to the organizational identification depicted in FIGS. 2 and 3 but those of skill will recognize that the groupings of CSPs 18 shown in FIGS. 2 and 3 are not dictated by the invention but are provided merely as an exemplar organizational strategy to assist in understanding the present invention.

Various discrete components such as termination resistors, bypass capacitors, and bias resistors, in addition to the circuits 19 shown on side 8 of flex circuit 12, may be mounted on either or both of sides 8 and 9 of flex 12. Flex circuit 12 may also depicted with reference to its perimeter edges, two of which are typically long ($PE_{long1}$ and $PE_{long\,2}$) and two of which are typically shorter ($PE_{short1}$ and $PE_{short2}$). Other embodiments may employ flex circuits 12 that are not rectangular in shape and may be square in which case the perimeter edges would be of equal size or other convenient shape to adapt to manufacturing particulars. Other embodiments may also have fewer or greater numbers of ranks or pluralities of ICs in each field or on a side of a flex circuit.

Those of skill will understand that the present invention may be implemented with only a single row of module contacts 20 rather than the two rows shown and may, in other embodiments, be implemented as a module bearing ICs on only one side of flex circuit 12 or only one side of flex circuit 12.

Figure 4:
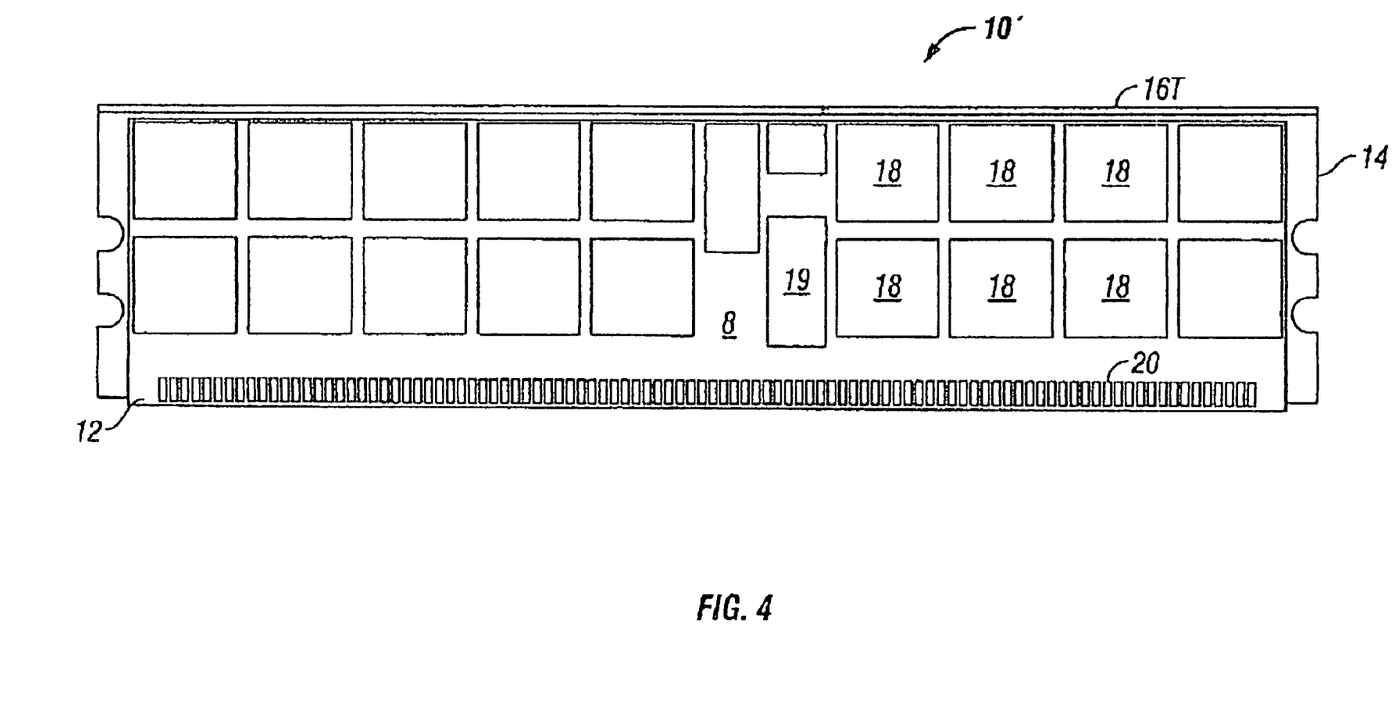
FIG. 4 is a depiction of an embodiment in accordance with the present invention.

FIG. 4 is a view of a module 10 devised in accordance with a preferred embodiment of the present invention. FIG. 4 depicts a module 10 that exhibits a single extension 16T for substrate 14 and shows how flex circuitry 12 is disposed about substrate 14 to place side 8 of flex circuit 12 on the exterior side of module 10.

Figure 5:
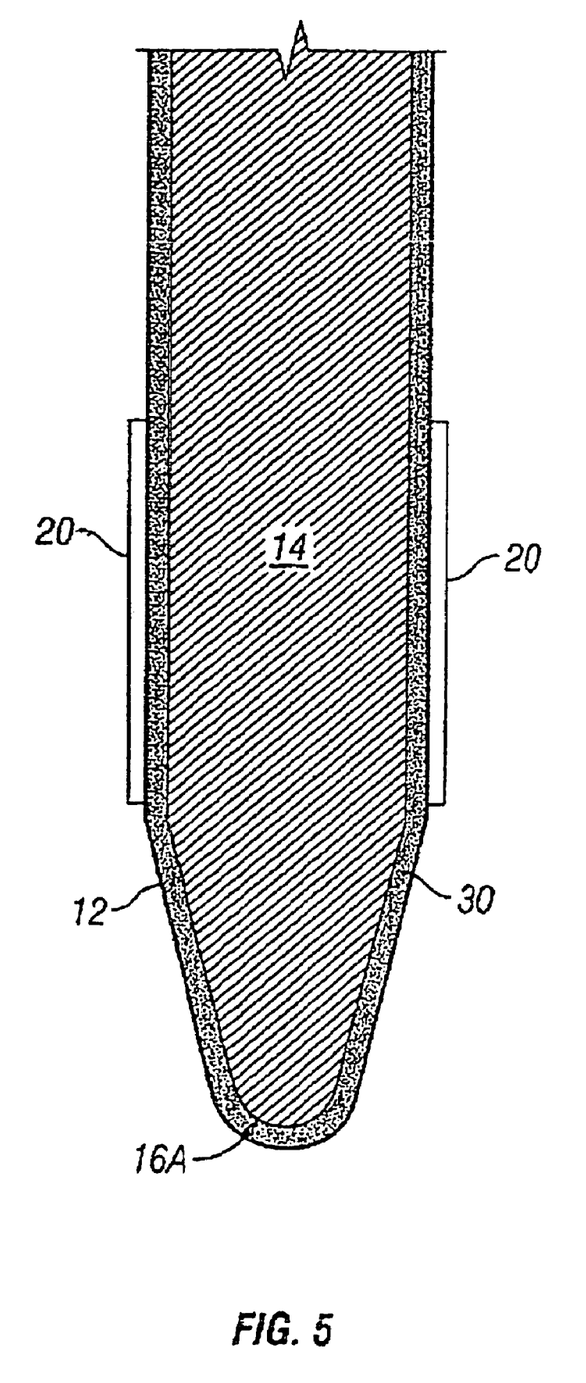
FIG. 5 depicts an enlarged area about end of a preferred module devised in accordance with the present invention.

FIG. 5 is an enlarged view of the area marked 'A' in FIG. 1. Edge 16A of substrate 14 is shaped like a male side edge of an edge card connector. While a particular oval-like configuration is shown, edge 16A may take on other shapes devised to mate with various connectors or sockets. The form and function of various edge card connectors are well know in the art. In many preferred embodiments, flex 12 is wrapped around edge 16A of substrate 14 and may be laminated or adhesively connected to substrate 14 with adhesive 30. The depicted adhesive 30 and flex 12 may vary in thickness and are not drawn to scale to simplify the drawing. The depicted substrate 14 has a thickness such that when assembled with the flex 12 and adhesive 30, the thickness measured between module contacts 20 falls in the range specified for the mating connector. In other instances, multiple flex circuits may be employed in a single module 10 or a single flex circuit may connect one or both sets of contacts 20 to the resident CSPs.

While module contacts 20 are shown protruding from the surface of flex circuit 12, other embodiments may have flush contacts or contacts below the surface level of flex 12. Substrate 14 supports module contacts 20 from behind flex circuit 12 in a manner devised to provide the mechanical form required for insertion into a socket. In other embodiments, the thickness or shape of substrate 14 in the vicinity of perimeter edge 16A may differ from that in the body of substrate 14. Substrate 14 in the depicted embodiment is preferably made of a metal such as aluminum or copper or alloys of such metals, as non-limiting examples, or where thermal management is less of an issue, materials such as FR4 (flame retardant type 4) epoxy laminate, PTFE (poly-tetra-fluoro-ethylene) or plastic. In another embodiment, advantageous features from multiple technologies may be combined with use of FR4 having a layer of copper on both sides to provide a substrate 14 devised from familiar materials which may provide heat conduction or a ground plane.

The advanced memory buffer or "AMB" is the new buffer technology particularly for server memory and typically includes a number of features including pass-through logic for reading and writing data and commands and internal serialization capability, a data bus interface, a deserializing and decode logic capability and clocking functions. The functioning of an AMB is the principal distinguishing hard feature of a FB-DIMM module. Those of skill will understand how to implement the connections between ICs 18 and AMB 19 in FB-DIMM circuits implemented by embodiments of the present invention and will recognize that the present invention provides advantages in capacity as well as reduced impedance discontinuity that can hinder larger implementations of FB-DIMM systems. Further, those of skill will recognize that various principles of the present invention can be employed to multiple FB-DIMM circuits on a single substrate or module.

Figure 6:
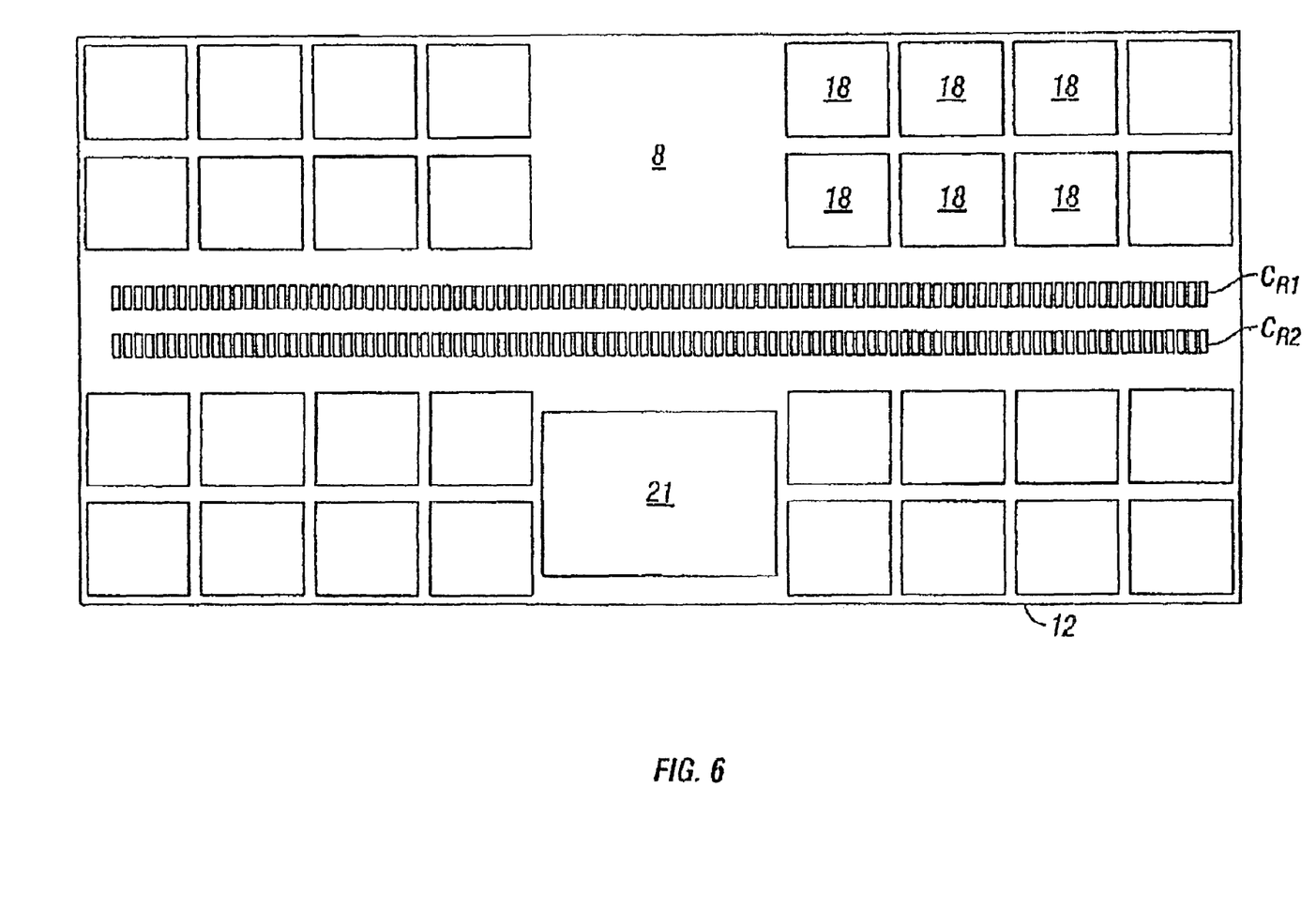
FIG. 6 depicts a first side of a flex circuit for employment in a preferred embodiment of the present invention.

FIG. 6 depicts side 8 of flex circuit 12 populated with plural flip-chip CSPs 18 and an AMB 21. Although AMB 21 is shown on side 8 of the depicted flex circuit, those of skill will recognize that it may be mounted on side 9 of flex circuit 12 although the techniques for space management of packaged devices such as an AMB that are disclosed in co-pending U.S. patent application Ser. No. 11/058,979, filed Feb. 16, 2005 and commonly owned by the present assignee Staktek Group L.P., and which application has been incorporated by reference herein, may be profitably used when the AMB is disposed on what will be the inner side of a module 10.

Figure 7:
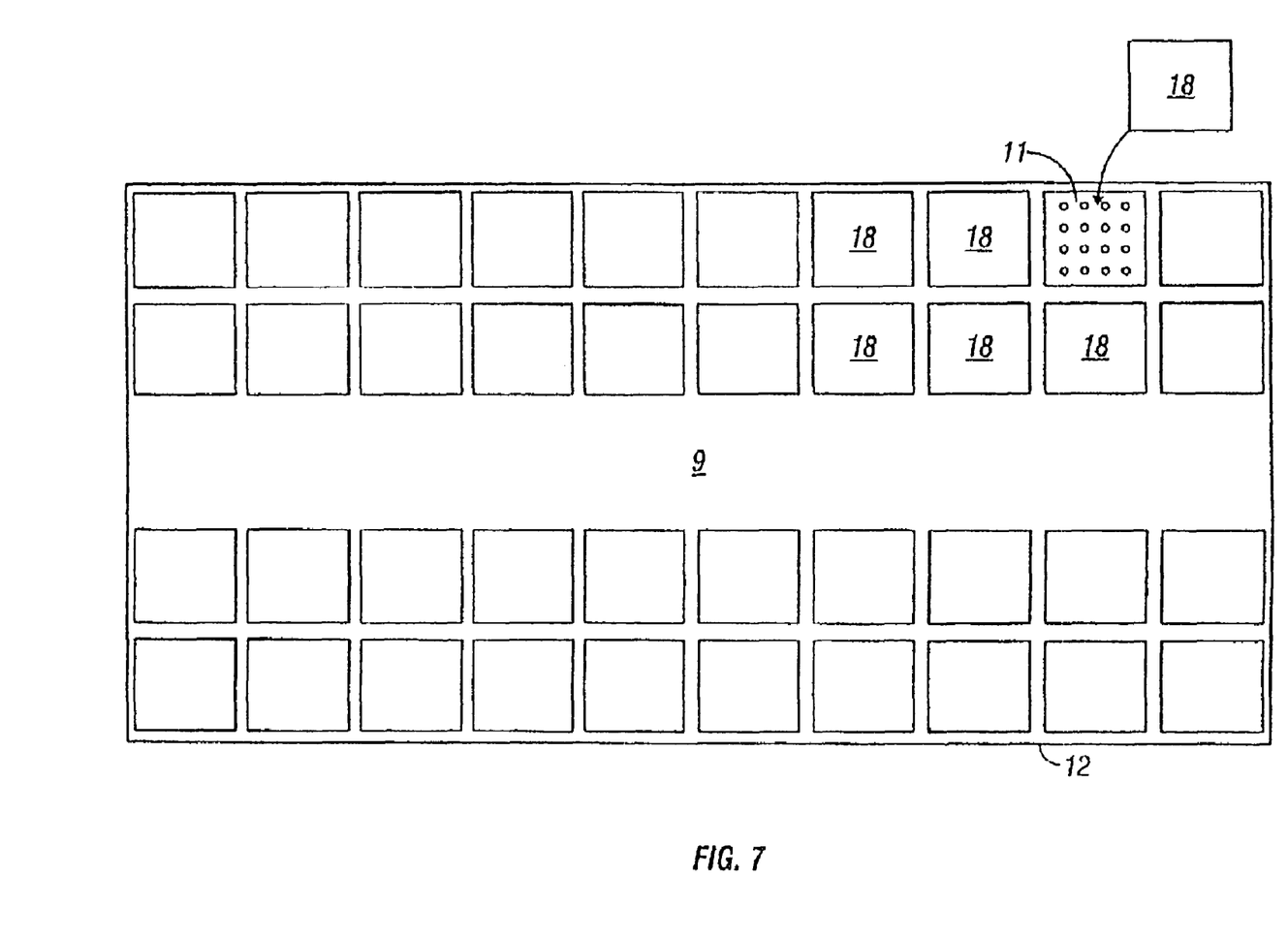
FIG. 7 depicts a second side of the flex circuit depicted in FIG. 6.

FIG. 7 depicts side 9 of flex circuit 12 as may be employed in a FB-DIMM instantiation of a preferred embodiment of the present invention.

The present invention may be employed to advantage in a variety of applications and environment such as, for example, in computers such as servers and notebook computers by being placed in motherboard expansion slots to provide enhanced memory capacity while utilizing fewer sockets. Two high rank embodiments or single rank high embodiments may both be employed to such advantage as those of skill will recognize after appreciating this specification.

One advantageous methodology for efficiently assembling a circuit module 10 such as described and depicted herein is as follows. In a preferred method of assembling a preferred module assembly 10, flex circuit 12 is placed flat and both sides populated according to flip-chip to flex assembly techniques known in the art such as those techniques earlier discussed herein, for example. Flex circuit 12 is then folded about end 16A of substrate 14. Flex 12 may be laminated or otherwise attached to substrate 14.

Although the present invention has been described in detail, it will be apparent to those skilled in the art that many embodiments taking a variety of specific forms and reflecting changes, substitutions and alterations can be made without departing from the spirit and scope of the invention. Therefore, the described embodiments illustrate but do not restrict the scope of the claims.

What is claimed is:

1. A circuit module comprising:
a flexible circuit having a first major side and a second major side, the flexible circuit exhibiting along the first major side, first-side first and second sets of contact site arrays between which is located at least one row of connector contacts, the second major side of the flexible circuit exhibiting second-side first and second sets of contact site arrays, each of the first-side and second-side first and second sets of contact site arrays comprising at least two surface mount arrays;
a first plurality of CSPs that populate the at least two surface mount arrays of the first-side first and second sets of contact site arrays and a second plurality of CSPs that populate the at least two surface mount arrays of the second-side first and second sets of contact site arrays, respectively;

a substrate comprised from metallic material and having an end about which the flexible circuit is disposed to place the second plurality of CSPs closer to the substrate than are disposed the first plurality of CSPs.

2. The circuit module of claim 1 in which the substrate has at least one extension.

3. The circuit module of claim 1 further comprising an advanced memory buffer disposed on the first side of the flexible circuit.

4. The circuit module of claim 1 further comprising an advanced memory buffer disposed on the second side of the flexible circuit.

5. The circuit module of claim 1 in which the first and second pluralities of CSPs are comprised of memory circuit CSPs.

6. The circuit module of claim 1 connected to a main circuit board employed in a computer.

7. The circuit module of claim 6 in which the computer is a server computer.

8. The circuit module of claim 6 in which the computer is a notebook computer.

* * * * *